(12) United States Patent
Kneezel et al.

(10) Patent No.: US 6,436,793 B1
(45) Date of Patent: Aug. 20, 2002

(54) METHODS OF FORMING SEMICONDUCTOR STRUCTURE

(75) Inventors: Gary A. Kneezel, Webster; Daniel E. Kuhman, Fairport; Brian T. Ormond, Webster; Ackerman C. John; Almon P. Fisher, both of Rochester; Allan F. Camp, Brockport; Lawrence H. Herko, Palmyra, all of NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/749,692

(22) Filed: Dec. 28, 2000

(51) Int. Cl.[7] ............................................... H01L 21/30
(52) U.S. Cl. ......................................... 438/458; 438/21
(58) Field of Search ........................ 438/21, 455, 458, 438/459

(56) References Cited

U.S. PATENT DOCUMENTS

| | | | | |
|---|---|---|---|---|
| 5,306,370 A | * | 4/1994 | Herko et al. | 156/155 |
| 5,620,614 A | * | 4/1997 | Drake et al. | 216/27 |
| 6,114,191 A | * | 9/2000 | Young et al. | 438/125 |

* cited by examiner

*Primary Examiner*—John F. Niebling
*Assistant Examiner*—Christopher Lattin
(74) *Attorney, Agent, or Firm*—Oliff & Berridge PLC (57) ABSTRACT

A method of forming a semiconductor structure from a first wafer and a second wafer. A pit or groove is formed in a lower surface of the first wafer. The lower surface of the first wafer is bonded to an upper surface of the second wafer. A groove is then formed on an upper surface of the first wafer, such that an opening is formed in the first wafer that exposes at least one alignment reference target on the upper surface of the second wafer. The bonded first wafer and second wafer is then diced using the exposed at least one alignment reference target to form a semiconductor structure.

30 Claims, 4 Drawing Sheets

METHODS OF FORMING SEMICONDUCTOR STRUCTURE

BACKGROUND OF THE INVENTION

1. Field of Invention

This invention relates to methods of forming semiconductor structures.

2. Description of Related Art

Semiconductor structures may be formed by bonding two wafers together and cutting the bonded wafers into individual semiconductor structures. For example, thermal ink jet printheads conventionally include a heater plate and a channel plate. The heater plate includes a surface having a plurality of resistive heating elements and passivated addressing electrodes. The surface of the heater plate having a plurality of resistive heating elements and passivated addressing electrodes is known as the electronic plane. A polymer layer containing fluidic passageways may be photopatterned on the surface of the heater wafer. Fluidic passageways or channels may also be formed on a surface of the channel plate. Several hundred corresponding heater die and channel die typically reside on the two respective wafers. The two corresponding bonded die are known collectively as a die module.

Conventionally, thermal ink jet die modules are formed by producing sets of heating element arrays and associated addressing electrodes on a first silicon wafer. Alignment marks are placed on the first silicon wafer at predetermined locations by any suitable process, such as by deposition and patterning of a metallic layer. Corresponding sets of fluidic passageways and associated manifolds are produced in a second silicon wafer. Alignment features are etched in the second silicon wafer at corresponding predetermined locations. The two wafers are aligned via the respective etched and metallized alignment features on the two wafers, for example by using infrared illumination to view the alignment features on the two wafers. The two wafers are then bonded together and diced into many separate die modules.

SUMMARY OF THE INVENTION

Cutting or dicing bonded wafers is often an important step in forming the individual semiconductor structures. The performance of the semiconductor structure may ultimately depend upon the accuracy of the dicing cut.

For example, when forming individual thermal ink jet die modules, a dicing blade is used to dice the bonded silicon wafers into individual die. Dicing cuts are made to separate the various rows and columns of the two dimensional array of die modules. Dicing fiducial marks on the heater wafer are used as reference marks for positioning the cuts. In a side shooting printhead, some dicing cuts are made across grooves that form individual jetting channels. These grooves are formed either by photopatterning the polymer layer on the heater wafer or by etching the surface of the channel wafer. In these dicing cuts, the dicing blade creates a smooth nozzle surface having no chip defects. The position of the nozzle dicing cut is important because the dicing position affects the fluid dynamics of ink ejected from the nozzles. For example, the distance from the bubble nucleating heater to the front of the device affects the drop velocity and the drop volume. Ultimately, the quality of printed documents is impacted by the position of the nozzle dicing cut. Thus, improved control over cut position would achieve better jetting performance.

Controlling the cut position on bonded silicon wafers depends on the positional or placement accuracy of the dicing saw used to create the nozzle surface. The cut placement accuracy depends on various factors, including index accuracy, operator/optical error, offset error, dicing blade cut consistency and angle of the cut. Cut placement accuracy can be affected by side forces generated when the dicing blade passes through the bonded wafer pair. These side forces can cause a row of die mounted on a material, such as a dicing tape, to shift on the material by as much as several microns. Cut placement accuracy can also be affected by blade bending, which can increase over time as the materials forming the dicing blade become fatigued due to repeated flexing. As blade bending and blade wear increase, the top edge of the cut no longer reflects the cut edge that is located, for example, at the electronic plane. The top edge of the cut may, in some instances, be 15 $\mu$m out of position from the cut at the electronic plane.

Previously, for bonded wafer pairs, a single set of dicing fiducials on the electronic plane has been made visible by etching a corresponding opening all the way through the channel wafer. The conventional method for dicing such wafer pairs includes operating the dicing saw in an open loop mode using the single set of fiducials to line up the first cut. That is, the position of the dicing saw is not adjusted based on the previous cut and/or measurements made during the current cut. In fact, conventionally for bonded wafer pairs, the dicing saw can not make adjustments based on the previous cut because the cut position at the electronic plane can not be viewed optically. Although one could etch holes all the way through the channel wafer to view alignment features in each row to be diced, there are two problems with this approach: 1) The orientation dependent etching of the silicon channel wafer does not etch holes perpendicular to the wafer, but at an angle. In order to etch a hole large enough to see the dicing fiducial, the actual silicon real estate required is quite large, so that space is consumed that could otherwise be used for making die. 2) Dicing through the large etched holes can cause the blade to deflect, causing additional error in the cut position.

Fully automatic saws are well known in the industry, but have not been used in dicing bonded wafer pairs because of the inability of fully automatic saws to optically view the cut position at the electronic plane. Some known dicing saws, such as the Disco 640 and the Kulicke and Soffa 980, have pattern recognition, which enables the saw to locate reference targets and align the dicing blade with the wafer fully automatically in the X,Y,Z and $\theta$ directions. In addition, some saws have kerf check software, which enables these dicing saws to determine how far from the dicing target the actual cut was made. This value is used to calculate a Y-offset value for error correction for the next dicing cut. This combination of features enables the saw to correct for cut placement errors fully automatically and to provide more accurate cuts than the equivalent saw used in an open loop mode. However, these features are not presently useable in bonded wafer dicing because the row-by-row dicing targets are hidden from view at the electronic plane by the channel wafer.

An alternative approach is views the electronic plane through the silicon channel wafer using an infrared camera. However, this approach has not allowed the complete use of the features of fully automatic saws. While the dicing reference targets can be viewed at infra-red wavelengths, the dicing cut edge can not be viewed. This is because the bevel produced by the dicing blade casts a broad shadow over the cut edge at the electronic plane. The shadow effectively masks the view of the cut edge, preventing the cut position from being accurately determined.

This invention provides systems and methods that allow for improved accuracy in forming individual semiconductor devices from bonded wafers.

This invention separately provides systems and methods that allow using certain features of fully automatic dicing saws that previously were not capable of being used in dicing bonded semiconductor wafers.

This invention separately provides systems and methods that allow for fully automatic dicing saws to be used in a closed-loop mode.

This invention separately provides systems and methods that allow for improved control over cut position when cutting thermal ink jet printhead nozzle faces to achieve improved ink jetting performance.

This invention separately provides systems and methods that allow fully automatic dicing saws to optically view dicing reference targets at the electronic plane of bonded semiconductor wafers.

This invention separately provides systems and methods that prevent coolant from obscuring dicing reference targets at the electronic plane of bonded semiconductor wafers.

This invention separately provides systems and methods for forming a semiconductor structure from a first wafer and a second wafer.

Various exemplary embodiments of the methods according to this invention comprise one or more of removing a first portion of a lower surface of the first wafer; bonding the lower surface of the first wafer to an upper surface of the second wafer; removing a second portion on an upper surface of the first wafer, such that an opening is formed in the first wafer that exposes at least one alignment reference target on the upper surface of the second wafer; optionally coating at least a portion of at least one of the surfaces that form the opening; and dicing the bonded first wafer and second wafer using the exposed at least one alignment reference target to form a semiconductor structure.

These and other features and advantages of the invention are described in, or are apparent from, the following detailed description of various exemplary embodiments of the systems and methods according to this invention.

BRIEF DESCRIPTION OF THE DRAWINGS

Various exemplary embodiments of this invention will be described in detail, with reference to the following figure, wherein.

DETAILED DESCRIPTION OF EXEMPLARY EMBODIMENTS

Exemplary embodiments of the methods according to this invention provide a method of forming semiconductor structures from two wafers. The various exemplary embodiments of the methods according to this invention achieve more precise formation of semiconductor structures.

For example, the various exemplary embodiments of the methods according to this invention enable using certain features of fully automatic dicing saws that previously were not capable of being used for bonded wafer pairs. These features of the fully automatic dicing saw may include pattern recognition, which enables the saw to locate reference targets and align the wafers fully automatically before dicing. These features may also include kerf checking, which enables the saw to determine how far from the dicing target the actual cut was made so that the fully automatic dicing saw can adjust the next cut accordingly. Exemplary embodiments of the methods according to this invention allow fully automatic saws to operate in a closed-loop mode, so that factors such as blade bending, blade wear, or movement of the dicing target due to side forces generated by the dicing saw can be taken into account and adjusted for from cut to cut.

FIGS. 1–7 illustrate various steps in a first exemplary embodiment of the methods of forming semiconductor structures according to this invention. In this first exemplary embodiment, a thermal ink jet die module is formed. However, the methods according to this invention can also be used to form any other known or later-developed semiconductor structures.

Figure 1:
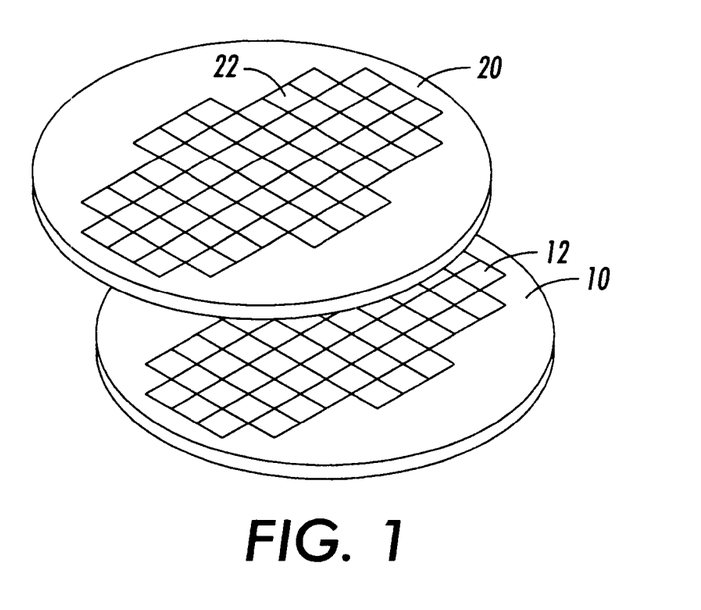
FIG. 1 illustrates a pair of wafers used to form multiple die modules for thermal ink jet printheads.

FIG. 1 illustrates a plurality of wafers used to form a set of bonded semiconductor wafers. Such bonded semiconductor wafers can be used, for example, to form thermal ink jet printhead die modules. Accordingly, the following description of various exemplary embodiments of the systems and methods according to this invention will refer to such thermal ink jet die modules. However, it should be appreciated that the systems and methods of this invention can be used with any set of two or more bonded semiconductor wafers, regardless of the ultimate functionality or use of the resulting dies.

Thus, for thermal ink jet printhead die modules, the plurality of wafers includes a heater wafer 10 and a channel wafer 20. The heater wafer 10 and the channel wafer 20 are typically silicon wafers. However, it should be understood that the wafers can be made of any other suitable semiconductor material, such as, for example, gallium arsenide. Both the heater wafer 10 and the channel wafer 20 are typically divided into areas corresponding to individual thermal ink jet printhead die modules. FIG. 1 shows the heater wafer 10 divided into individual die areas 12 and the channel wafer 20 divided into individual die areas 22.

Figure 2:
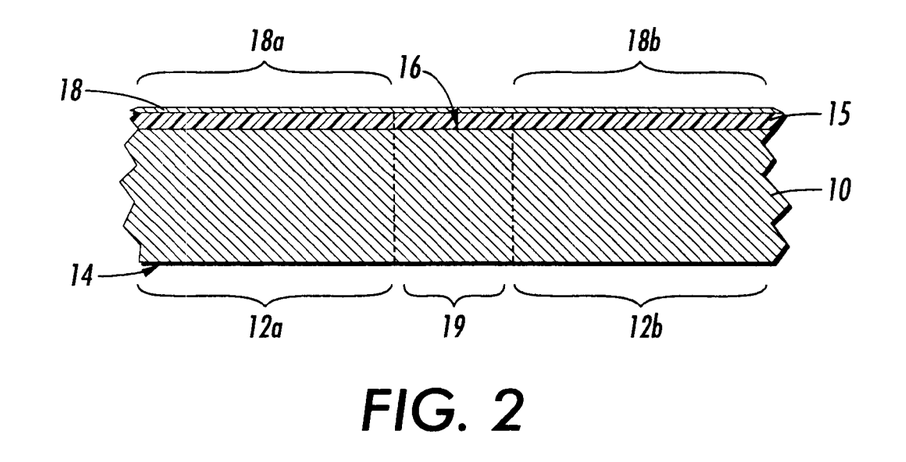
FIG. 2 illustrates a sectional view of a portion of a heater wafer.

FIG. 2 is a sectional view showing a portion of the heater wafer 10 in an area between two individual die areas 12a and 12b on the heater wafer 10. The heater wafer 10 includes a bottom surface 14 and an upper surface 16. An electrically insulating layer (not shown) is deposited on one or both of the bottom surface 14 and the upper surface 16. The electrically insulating layer comprises a combination of one or more suitable electrically insulating material that can be deposited on the heater wafer 10. For example, the insulating material can be silicon dioxide or silicon nitride. The insulating material can be formed on the heater wafer by any suitable process.

Figure 7:
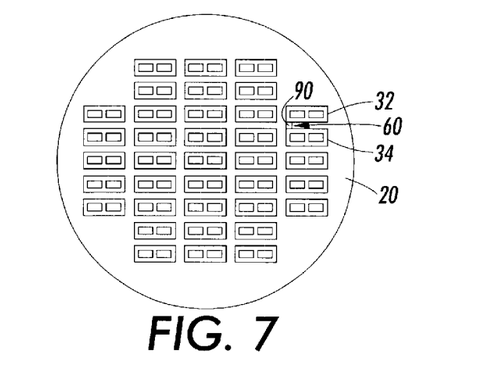
FIG. 7 illustrates a top view of one exemplary embodiment of a channel wafer after a third step of one exemplary embodiment of a method according to this invention has been performed on the heater and channel wafers.

A plurality of linear arrays of resistors or heating elements 18 and associated addressing electrodes (not shown) are formed on the insulating layer on the upper surface 16. Each linear array of heating elements 18 corresponds to an individual die area 12. In FIG. 2, a first group of heating elements 18a corresponds to the individual die area 12a and a second group of heating elements 18b corresponds to the individual die area 12b. Non-die areas, or "streets", 19 are provided between the individual die areas 12 on which no heating elements 18 are formed. FIG. 2 shows a street 19 between the individual die areas 12a and 12b. Reference targets, as shown in FIG. 7, are formed within the street 19. In various exemplary embodiments, each heating element 18 is selectively addressable through the addressing electrodes.

A photopatternable film layer 15 is formed on the upper surface 12 of the heater wafer 10. The photopatternable film layer 15 may be any suitable polymer, such as a polyimide. The photopatternable film layer 15 can be formed, for example, by any suitable deposition process, such as putting liquid precursor material in solvent onto a wafer which is then rapidly rotated on a spinner in order to form a thin flat layer. The photopatternable film layer 15 is patterned for etch removal at selected locations to expose the heating elements 18a and 18b formed on the heater wafer 10. FIG. 2 shows the photopatternable film layer 15 removed between and above the heating elements 18.

Figure 3:
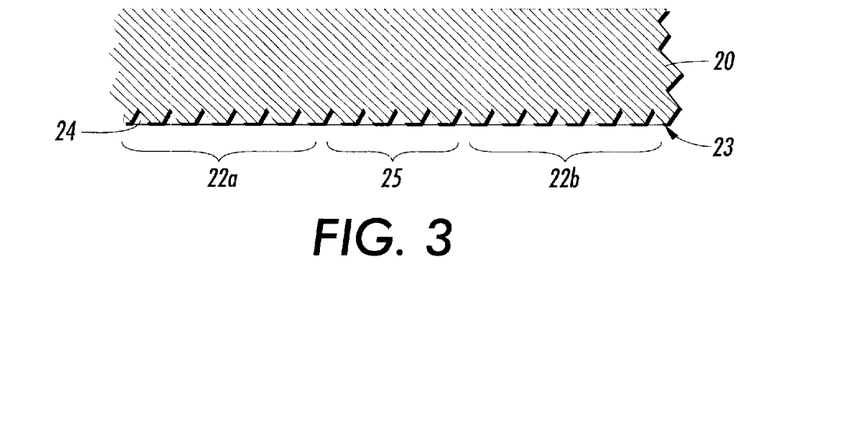
FIG. 3 illustrates a sectional view of a portion of a channel wafer.

FIG. 3 is a sectional view showing a portion of the channel wafer 20 including a non-die, or street, area 25 between two individual die areas 22a and 22b on the channel wafer 20. The channel wafer 20 includes channels 24 formed on a lower surface 23. The channels 24 can have various shapes, such as, for example, triangular or rectangular shapes. The channels 24 may be formed by any suitable method, such as by etching the channel wafer 20 using any suitable etching process. The channel wafer 20 has a street 25 that corresponds to the street 19 of the heater wafer 10. Optionally, the polymer film, rather than the channel wafer 20, can be patterned to form fluidic channels.

Conventionally, a plurality of thermal ink jet printhead dies are formed by aligning and bonding together the heater wafer 10 and the channel wafer 20. Each channel 24 is aligned above a heater element 18 of the heater wafer 10. The heater wafer 10 and the channel wafer 20 are bonded together so that the film layer 15 is sandwiched between the heater wafer 10 and the channel wafer 20 and each channel 24 is opposite a corresponding heating element 18. The bonded wafers 10 and 20 are then separated into a plurality of individual printhead dies by dicing. The bonded wafers 10 and 20 are diced using a dicing saw. Dicing fiducial reference targets, such as that shown in FIG. 7, located on the surface 12 of the heater wafer 10 are hidden from view once the heater wafer 10 and the channel wafer 20 are bonded together. One set of dicing reference marks is made visible to align the first cut. Thereafter, the saw simply cuts each row at a preprogrammed distance from the previous cut. Thus, the dicing saw is operated in an open-loop mode, making cut accuracy difficult.

Figure 4:
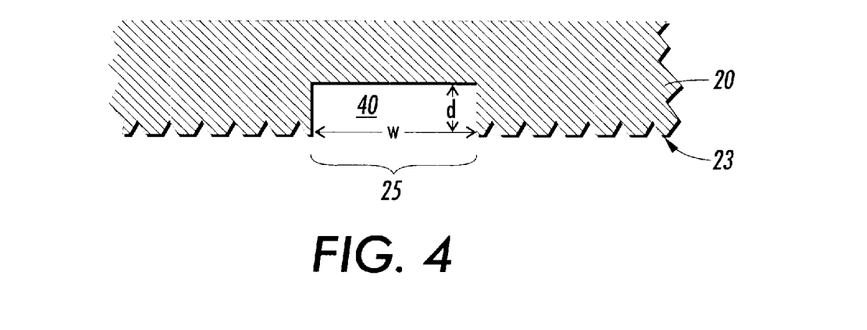
FIG. 4 illustrates one exemplary embodiment of a channel wafer after a first step of one exemplary embodiment of a method according to this invention has been performed on the channel wafer.
Figure 5:
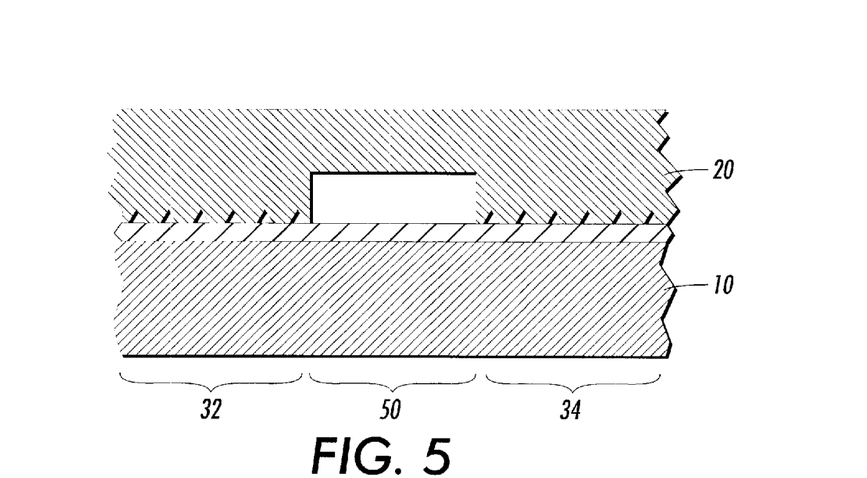
FIG. 5 illustrates one exemplary embodiment of a channel wafer after a second step of one exemplary embodiment of a method according to this invention has been performed on the channel wafer.
Figure 6:
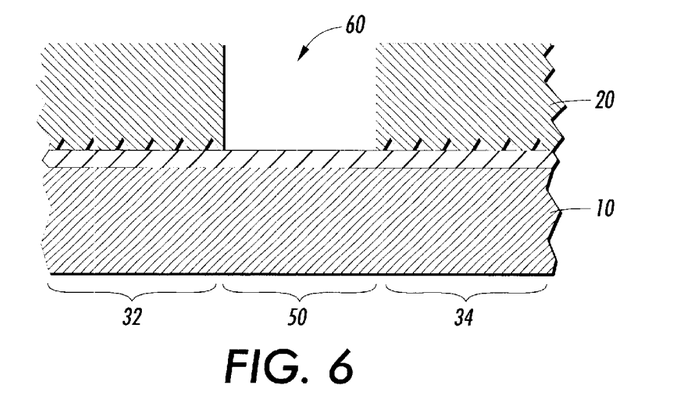
FIG. 6 illustrates one exemplary embodiment of a channel wafer after a third step of one exemplary embodiment of a method according to this invention has been performed on the channel wafer.

The various exemplary embodiments of the systems and methods of this invention, including the exemplary embodiment illustrated in FIGS. 4–6, allow for the dicing saw to be used in a closed-loop mode.

FIG. 4 illustrates one exemplary embodiment of a channel wafer 20 after a first step of one exemplary embodiment of a method according to this invention has been performed on the channel wafer 20. In this first step, material is removed from the lower surface 23 of the channel wafer 20 in the street 25. In various exemplary embodiments, an opening, such as a groove 40, or in other exemplary embodiments, a pit, is formed in the surface 23 of the channel wafer 20. That is, a groove can be considered as a pit having one elongated dimension. In other words, the groove is one species of the more generic term "pit". The groove or pit 40, can be formed by any suitable material removing method, such as cutting or etching during the channel wafer fabrication process. The groove or pit 40 typically has a width w of from about 0.2 mm to about 1.0 mm. The groove or pit 40 can be formed at a depth d ranging from about 10% to 50% of the wafer thickness.

FIG. 5 illustrates one exemplary embodiment of a heater wafer 10 and a channel wafer 20 after a second step of one exemplary embodiment of a method according to this invention has been performed on the heater and channel wafers 10 and 20. FIG. 5 is a sectional view showing a portion of the bonded heater wafer 10 and the channel wafer 20 between a pair of unseparated thermal ink jet printhead dies 32 and 34. The column dicing street 50 includes the streets 19 and 25 between the thermal ink jet printhead dies 32 and 34 and extends parallel to the channels 24 in the channel plate 20. In this second step, the channel wafer 20 is aligned with and bonded to the heater wafer 10, such that the film layer 15 is sandwiched between the heater wafer 10 and the channel wafer 20. The channel wafer 20 and the heater wafer 10 can be bonded together by any suitable technique, such as, for example the process described in U.S. Pat. No. 4,601,777.

FIG. 6 illustrates one exemplary embodiment of a heater wafer 10 and a channel wafer 20 after a third step of one exemplary embodiment of a method according to this invention has been performed on the heater and channel wafers 10 and 20. In this third step, the remaining portion of the channel wafer 20 in the column dicing street 50 is removed by dicing. By removing the material in the column dicing street 50 of only the channel wafer 20, an opening 60 is formed in the channel wafer 20 that allows optical viewing of the dicing reference targets on the surface 12 of the heater wafer 10 by the dicing saw.

FIG. 7 illustrates a top view of one exemplary embodiment of a channel wafer 20 after a third step of one exemplary embodiment of a method according to this invention has been performed on the heater and channel wafers 10 and 20. FIG. 7 shows a plurality of unseparated thermal ink jet printhead dies, including unseparated thermal ink jet printhead dies 32 and 34. A dicing reference target 90 is located on the surface 12 of the heater wafer 10. The opening 60 in the column dicing street 50 between the unseparated thermal ink jet printhead dies 32 and 34 allows the dicing saw to optically view the dicing reference target 90 on the surface 12 of the heater wafer 10.

The opening 60 formed in the channel wafer 20 allows a fully automatic dicing saw to optically view the dicing reference targets when dicing in a direction perpendicular to the direction of the opening 60 through the bonded heater wafer 10 and channel wafer 20 to form a nozzle face. Thus, the fully automatic dicing saw is able to operate in a closed-loop mode. The fully automatic saw is able to use its pattern recognition feature to locate the reference targets and align the saw fully automatically to the wafer in the X,Y,Z and θ directions. The fully automatic dicing saw is also able to use its kerf checking feature to determine how far from the selected dicing target the actual cut was made, and to adjust the next cut accordingly.

The opening 60 formed in the channel wafer 20 enables fully automatic dicing of a plurality of bonded wafers with fully automatic cut placement control. In various exemplary embodiments, by forming the opening 60 in the top bonded wafer, the cut placement error can be roughly cut in half, from a standard deviation of approximately 4.5μm to a standard deviation of approximately 2.0 μm.

During dicing the plurality of bonded wafers to form the individual dies, a liquid coolant, such as water, is often sprayed into the cutting area to cool the dicing blade. The coolant spray fills the opening 60 with coolant. The coolant can obscure the dicing reference targets. To prevent the coolant from obscuring the dicing reference targets, the opening 60 is, in various exemplary embodiments, made from about 500 μm to about 1000 μm wide. The size of such an opening 60 is very large by dicing standards. The large size of the opening 60 allows the coolant to be easily cleared from the opening by a forced air blow off generated by the dicing saw. To generate a kerf this large, two to four passes with a dicing blade are needed. The large kerf requires the use of more wafer space because all the column dicing streets need to be this wide to maintain wafer symmetry and compatibility with other wafer handling devices, such as wafer electrical probe stations. The space consumed by the large kerf wastes valuable real estate in the semiconductor wafer, and thus increases the cost of the individual dies, as well as making the dicing process more expensive due to the additional cuts needed.

Figure 8:
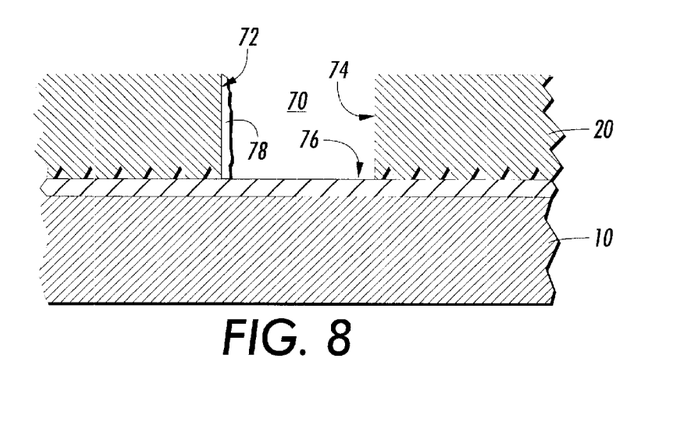
FIG. 8 illustrates one exemplary embodiment of a channel wafer after a fourth step of one exemplary embodiment of a method according to this invention has been performed on the channel wafer.

FIG. 8 illustrates one exemplary embodiment of a channel wafer after a fourth step of a second exemplary embodiment of a method according to this invention has been performed on the channel wafer. As shown in FIG. 8, in this second exemplary embodiment of the methods according to this invention, rather than forming the wide opening 60 in the top wafer 20, a standard size opening 70 is formed in the top wafer 20. As discussed above, the wide opening 60 allows the coolant to be driven out of the opening 60 due to the extra large width of the opening 60.

In contrast, in this second exemplary embodiment of the methods for forming semiconductor bonded wafer dies according to this invention, a standard-width, or even a narrow-width, opening 70 is formed in the top wafer 20. As discussed below, by properly treating one or more surfaces of the opening 70, the coolant can be driven from the opening 70 without resorting to the techniques described above with respect to the wide opening 60.

As shown in FIG. 8, the opening 70 includes a first side wall 72, a second side wall 74 opposite first side wall 72, and bottom wall 76. At least one portion of at least one of the side wall 72, the side wall 74, and the bottom wall 76 is made "coolant-phobic", i.e., nonwettable by the coolant. The at least one portion of the at least one of the side wall 72, the side wall 74, and the bottom wall 76 can be made coolant-phobic (i.e. nonwettable by the coolant) by any suitable process. For example, one or more of the side wall 72, the side wall 74 and/or the bottom wall 76 can be coated with a suitable coolant-phobic material or can be made "coolant-phobic" by plasma fluorination. In various exemplary embodiments, as illustrated in FIG. 7, one or more of the side wall 72, the side wall 74 and/or the bottom wall 76 is made coolant-phobic by coating the one or more of the side wall 72, the side wall 74 and/or the bottom wall 76 with a coolant-phobic material 78. When the coolant is water or an aqueous material, one exemplary embodiment of a suitable nonwettable, or coolant-phobic, material useable in the methods and bonded wafers processed according to this invention is RAIN-X®, which is commercially available. Other hydrophobic materials which may be used include fluorocarbons in a liquid solution, such as, for example, phenyltrimethoxysilane or (tridecafluoro-1,1,2,2-tetrahydrooctyl) triethoxysilane. The coolant-phobic material 78 can be flushed through the opening 70 by any suitable method. For example, the coolant-phobic material 78 can be flushed through the opening 70 using a syringe with a narrow tip. The coolant-phobic material 78 quickly fills the opening 70 without spreading to the rest of the channel wafer 20. The coolant-phobic material 78 does not overflow to the top of the channel wafer 20 using this technique. A light air flow can be used to drain the coolant-phobic material 78 to one side of the channel wafer 20. A suitable washing agent, such as acetone when the coolant-phobic material 78 is RAIN-X, is then flushed through the opening 70 to clear the opening 70 of excess coolant-phobic material 78.

In various exemplary embodiments, as illustrated in FIG. 8, the coolant is easily driven out of the opening 70 so that the fully automatic dicing saw can optically view the dicing reference targets on the surface of the heater wafer 10. Thus, the opening 70 does not need to be as large as the extra-wide opening 60 used in the previous exemplary embodiments of the methods for allowing the fully automatic dicing saw to be able to view the dicing reference targets. This, in turn, requires less passes with the dicing saw to make the opening 70 relative to the extra-wide opening 60, and prevents excessive waste of wafer real estate.

Figure 9:
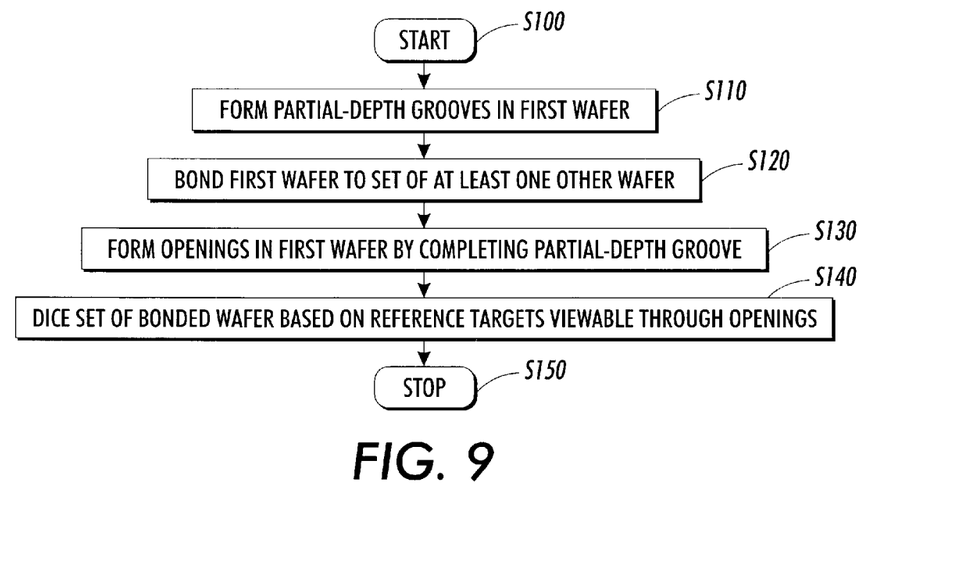
FIG. 9 is a flowchart outlining a first exemplary embodiment of a method for dicing bonded wafers according to this invention.
Figure 10:
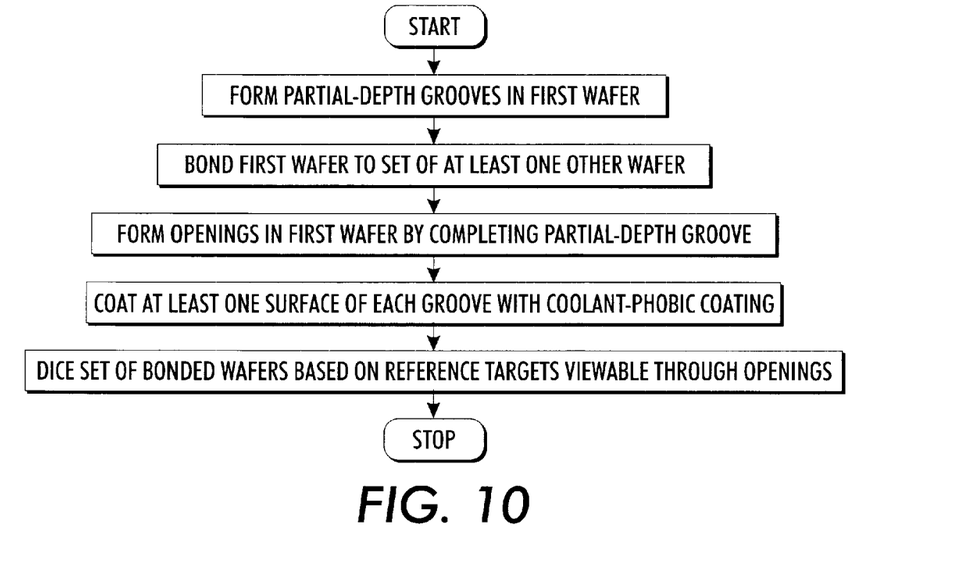
FIG. 10 is a flowchart outlining a second exemplary embodiment of a method for dicing bonded wafers according to this invention.

FIGS. 9 and 10 illustrate flowcharts that outline exemplary embodiments of a method for dicing bonded wafers according to this invention.

FIG. 9 illustrates a flowchart that outlines a first exemplary embodiment of a method for dicing bonded wafers according to this invention. Beginning in step S100, control continues to step S110, where a partial-depth groove or pit is formed in a first wafer. Then, in step S120, the first wafer is bonded to a set of at least one other wafer. Next, in step S130, openings are formed in the first wafer by completing the partial-depth groove so that an opening is formed in the first wafer. Then, in step S140, the set of bonded wafers are diced using the reference targets viewable through the opening in the first wafer. Control then continues to step S150, where the method ends.

FIG. 10 illustrates a flowchart that describes another exemplary embodiment of an algorithm used to execute the various exemplary embodiments of the systems and methods of this invention. Beginning in step S200, control continues to step S210, where a partial-depth groove or pit is formed in the first wafer. Then, in step S220, the first wafer is bonded to a set of at least one other wafer. Next, in step S230, openings are formed in the first wafer by completing the partial-depth groove so that openings are formed in the first wafer. Then, in step S240, at least one surface of opening is coated with a coolant-phobic coating. Next, in step S250, the set of bonded wafers are diced using the reference targets viewable through the opening in the first wafer. Control then continues to step S260, where the method ends.

It should be appreciated that, while the preceding description of the systems and methods of this invention has been made with respect to the heater wafer 10 and the channel wafer 20, the systems and methods according to this invention can be used with any semiconductor structures that use two or more bonded wafers where the dicing fiducials are located in the interior regions of the two or more bonded wafers.

While this invention has been described in conjunction with the specific exemplary embodiments outlined above, it is evident that many alternatives, modifications and variations will be apparent to those skilled in the art. Accordingly, the exemplary embodiments of the invention, as set forth above, are intended to be illustrative, not limiting. Various changes may be made without departing from the spirit and scope of the invention.

What is claimed is:

1. A method of forming a semiconductor structure from a set of bonded semiconductor wafers comprising at least a first wafer and a second wafer, the first wafer having an upper surface and a lower surface opposite the upper surface, the second wafer having a surface and at least one alignment reference target arranged on the surface of the second wafer, the method comprising:
   removing a first portion of the first water from the lower surface of the first wafer, the first portion of the first wafer located in a non-die area of the first wafer;
   bonding the lower surface of the first wafer to the surface of the second wafer;
   removing a second portion of the first wafer from the upper surface of the first wafer, the second portion of the first wafer located in the non-die area of the first wafer, such that an opening is formed in the first wafer that exposes at least one of the at least one alignment reference target on the surface of the second wafer; and
   dicing the bonded first wafer and second wafer using the exposed at least one alignment reference target to form the semiconductor structure.

2. The method of claim 1, wherein the first portion comprises at least one pit.

3. The method of claim 2, wherein at least one of the at least one pit is a groove.

4. The method of claim 2, wherein the at least one pit is formed by at least one of etching and cutting.

5. The method of claim 2, wherein the first wafer has a thickness and the at least one pit extends from about 10% to about 50% of the thickness of the first wafer.

6. The method of claim 1, wherein the second portion comprises at least one groove.

7. The method of claim 1, wherein dicing the bonded first wafer and second wafer comprises dicing using a fully automatic dicing saw.

8. The method of claim 7, wherein dicing the bonded first wafer and second wafer further comprises operating the fully automatic dicing saw in a closed-loop mode.

9. The method of claim 1, wherein the opening includes a first surface, a second surface opposite the second surface, and a bottom surface, the method further comprising coating at least a portion of at least one of the first surface, the second surface and the bottom surface with a coating before dicing the bonded first wafer and second wafer using a coolant that does not wet the coating.

10. The method of claim 1, wherein the first wafer and the second wafer comprise silicon.

11. The method of claim 1, further comprising forming an array of parallel grooves in the lower surface in die areas of the first wafer before bonding the first and second wafers.

12. The method of claim 11, further comprising forming an array of resistive heater elements and passivated addressing electrodes on the surface of the second wafer before bonding the first and second wafers.

13. The method of claim 12, wherein the bonded first and second wafers are diced perpendicular to the array of parallel grooves in the lower surface of the first wafer.

14. A method of forming a thermal ink jet printhead die module from at least a first wafer and a second wafer, the first wafer having an upper surface and a lower surface opposite the upper surface, the second wafer having a surface, the method comprising:
   forming an array of resistive heater elements and passivated addressing electrodes and at least one alignment reference target on the surface of the second wafer;
   forming a polymer layer over the surface of the second wafer;
   forming an array of parallel grooves in one of the lower surface of the first wafer and the polymer layer;
   removing a first portion of the first wafer from the lower surface of the first wafer, the first portion of the first wafer located in a non-die area of the first wafer;
   bonding the lower surface of the first wafer to the surface of the second wafer, wherein the array of parallel grooves are aligned with the array of resistive heater elements and passivated addressing electrodes on the surface of the second wafer;
   removing a second portion of the first wafer from the upper surface of the first wafer, the second portion of the first wafer located in the non-die area of the first wafer, such that an opening is formed in the first wafer that exposes at least one of the at least one alignment reference target on the surface of the second wafer; and
   dicing the bonded first wafer and second wafer using the exposed at least one alignment reference target to form the thermal ink jet printhead die module.

15. The method of claim 14, wherein the first portion comprises at least one pit.

16. The method of claim 15, wherein at least one of the at least one pit is a groove.

17. The method of claim 14, wherein the at least one pit is formed by at least one of etching and cutting.

18. The method of claim 14, wherein the second portion comprises at least one groove.

19. The method of claim 14, wherein dicing the bonded first wafer and second wafer comprises dicing using a fully automatic dicing saw.

20. The method of claim 19, wherein dicing the bonded first wafer and second wafer further comprises operating the fully automatic dicing saw in a closed-loop mode.

21. The method of claim 14, wherein the first wafer and the second wafer comprise silicon.

22. The method of claim 14, wherein the first wafer has a thickness and the at least one groove extends from about 10% to about 50% of the thickness of the first wafer.

23. A method of forming a thermal ink jet printhead die module from at least a first wafer and a second wafer, the first wafer having an upper surface and a lower surface opposite the upper surface, the second wafer having a surface, the method comprising:
   forming an array of resistive heater elements and passivated addressing electrodes and at least one alignment reference target on the surface of the second wafer;
   forming a polymer layer over the surface of the second wafer;
   forming an array of parallel grooves in one of the lower surface of the first wafer and the polymer layer;

removing a first portion of the first wafer from the lower surface of the first wafer, the first portion of the first wafer located in a non-die area of the first wafer;

bonding the lower surface of the first wafer to the upper surface of the second wafer, wherein the array of parallel grooves is aligned with the array of resistive heater elements and passivated addressing electrodes on the upper surface of the second wafer;

removing a second portion of the first wafer from the upper surface of the first wafer, the second portion of the first wafer located in the non-die area of the first wafer, such that an opening is formed in the first wafer that exposes the at least one alignment reference target on the surface of the second wafer, the opening including a first surface, a second surface opposite the first surface, and a bottom surface;

coating at least a portion of at least one of the first surface, the second surface and the bottom surface with a nonwettable coating; and dicing the bonded first wafer and second wafer using the exposed at least one alignment reference target to form a semiconductor structure.

24. The method of claim 23, further comprising forming a polymer layer on the surface of the second wafer, wherein the array of parallel grooves are formed in the polymer layer.

25. The method of claim 23, further comprising supplying a coolant into the opening while dicing such that the coolant is repelled by the nonwettable coating and the alignment reference targets remain exposed.

26. The method of claim 25, further comprising removing the coolant from the opening.

27. The method of claim 25, wherein the nonwettable coating comprises at least one of phenyltrimethoxysilane and (tridecafluoro-1,1,2,2-tetrahydrooctyl)triethoxysilane.

28. The method of claim 25, wherein the nonwettable coating is formed by plasma fluorination of the upper surface of the first wafer.

29. The method of claim 23, wherein dicing the bonded first wafer and second wafer comprises using a fully automatic dicing saw.

30. The method of claim 23, wherein dicing the bonded first wafer and second wafer further comprises operating the fully automatic dicing saw in a closed-loop mode.

* * * * *